United States Patent
Turqueti et al.

(10) Patent No.: US 10,240,875 B2
(45) Date of Patent: Mar. 26, 2019

(54) ACTIVE CRYOGENIC ELECTRONIC ENVELOPE

(71) Applicants: Marcos de Azambuja Turqueti, El Sobrante, CA (US); Robert Alan Albright, Oakland, CA (US); Soren O. Prestemon, Martinez, CA (US)

(72) Inventors: Marcos de Azambuja Turqueti, El Sobrante, CA (US); Robert Alan Albright, Oakland, CA (US); Soren O. Prestemon, Martinez, CA (US)

(73) Assignee: The Regents of the University of California, Oakland, CA (US)

( * ) Notice: Subject to any disclaimer, the term of this patent is extended or adjusted under 35 U.S.C. 154(b) by 530 days.

(21) Appl. No.: 14/790,614

(22) Filed: Jul. 2, 2015

(65) Prior Publication Data
US 2016/0061538 A1    Mar. 3, 2016

Related U.S. Application Data

(60) Provisional application No. 62/022,484, filed on Jul. 9, 2014.

(51) Int. Cl.
*F28F 13/00* (2006.01)
*F17C 13/02* (2006.01)
(Continued)

(52) U.S. Cl.
CPC .............. *F28F 13/00* (2013.01); *F17C 3/085* (2013.01); *F17C 13/02* (2013.01); *H05K 5/0213* (2013.01); *F28F 2013/006* (2013.01)

(58) Field of Classification Search
CPC ..... F28F 13/00; F28F 2013/006; F17C 13/02; F17C 3/085; H05K 5/0213
See application file for complete search history.

(56) References Cited

U.S. PATENT DOCUMENTS

| 5,224,777 A * | 7/1993 | Hayashi | G01K 7/25 340/584 |
| 5,657,635 A * | 8/1997 | Benoit | F25B 9/12 62/51.2 |
| 2010/0188082 A1* | 7/2010 | Morich | G01R 33/3806 324/307 |

FOREIGN PATENT DOCUMENTS

| EP | 0482546 A2 * | 4/1992 |
| JP | S6160030 A * | 3/1986 |

OTHER PUBLICATIONS

Fukushima et al., Signal Repeater for Use in Cryostat, Mar. 27, 1986, JPS6160030A, Whole Document.*

(Continued)

*Primary Examiner* — Larry Furdge

(57) ABSTRACT

A data acquisition module is disclosed for use with electronic components such as superconductive magnets wherein the electronic components and the data acquisition module may reside inside a cryostat. The data acquisition module allows conventional electronic technologies to work inside cryostats at cryogenic temperatures as low as 4° K. This is achieved by management of heat inside the module to keep the module operating at a temperature above the cryogenic temperature. This approach avoids the difficulties that arise from changes in carrier mobility in semiconductors operating at deep cryogenic temperatures. A cryogenic system comprises a cryostat containing a cryogenic fluid and at least one sensor, and a data acquisition module located within the cryostat, the module in communication with the at least one sensor to acquire data, wherein the module comprises a thermal package, a conditioning and digitizing electronic module, a controller module, a power module, and a thermal management module.

20 Claims, 5 Drawing Sheets

(51) Int. Cl.
  *F17C 3/08* (2006.01)
  *H05K 5/02* (2006.01)

(56) References Cited

OTHER PUBLICATIONS

Riedel et al., Cooling Device for Optical and/or Electronic Elements, Apr. 29, 1992, EP0482546A2, Whole Document.*
Turqueti et. al., "Deep cryogenic low power 24 bits analog to digital converter with active reverse cryostat" Physics Procedia, vol. 67, pp. 1175-1180, 2015.
Goodzeit et. al., "Measurement of internal forces in superconducting accelerator magnets with strain gauge transducers." IEEE Transactions on Magnetics, vol. 25, No. 2, pp. 1463-1468, Mar. 1989.
Marchevsky et. al., "Test of the High-Field Nb3Sn Dipole Magnet HD3b." IEEE Transactions on Applied Superconductivity, vol. 24, No. 3, Jun. 2014.
Patterson et. al., "Assessment of electronics for cryogenic space exploration missions." Cryogenics, vol. 46, pp. 231-236, Dec. 1, 2005.
Thorn, L.B.N.E. Cold Electronics Development for the, and LArTPC, the Technology and Instrumentation in Particle Physics 2011 (TIPP 2011) Conference, pp. 9-14.
Mukhanov et. al., "Superconductor Analog-to-Digital Converters." Proceedings of the IEEE, vol. 92, No. 10, pp. 1564-1584, Oct. 2004.
Rondeaux et. al., "Thermal conductivity measurements of epoxy systems at low temperature." AIP Conference Proceedings, vol. 614, pp. 197-203, (2002).
Garrett et. al., "The thermal conductivity of epoxy-resin / powder composite materials." Journal of Physics D: Applied Physics, vol. 7, No. 9, Article No. 311, pp. 1247-1258.

\* cited by examiner

ACTIVE CRYOGENIC ELECTRONIC ENVELOPE

CROSS REFERENCE TO RELATED APPLICATIONS

This application claims priority to U.S. Provisional Patent Application No. 62/022,484, filed Jul. 9, 2014, which is herein incorporated by reference.

STATEMENT OF GOVERNMENTAL SUPPORT

The invention described and claimed herein was made in part utilizing funds supplied by the U.S. Department of Energy under Contract No. DE-AC02-05CH11231 between the U.S. Department of Energy and the Regents of the University of California for the management and operation of the Lawrence Berkeley National Laboratory. The government has certain rights in this invention.

BACKGROUND OF THE INVENTION

Field of the Invention

The present invention relates to the field of instrumentation for cryogenic systems.

Related Art

Instrumentation for cryogenic systems is a challenging problem that requires costly custom made electronics. The vast majority of commercially available active electronic components do not operate at temperatures below −50° C. This is due to several factors such as carrier freeze out, hot-carrier effects, and commercially available systems not being generally designed for low temperature operation.

Although the majority of commercial electronic systems operate above −50° C., there are a significant number of applications that need to operate at temperatures below −50° C., such as Liquid Natural Gas (LNG) storage and transportation, Magnetic Resonance Imaging (MRI), biology and physics experiments, superconducting magnets, cryogenic freezers, and several other industrial processes.

Currently, instrumentation and data acquisition for these systems is usually broken into two environments; with sensors in a cold part (e.g. a cryostat), and front-end and conditioning electronics outside at room temperature.

A cryostat is a device used to maintain low cryogenic temperatures of samples or devices mounted within the cryostat. Low temperatures may be maintained within a cryostat by using various refrigeration methods, most commonly using a cryogenic fluid bath such as liquid helium. Hence it is usually assembled into a vessel, similar in construction to a vacuum flask or Dewar. Cryostats have numerous applications within science, engineering, and medicine.

Sensors may be attached to a device inside the cryostat and wires may connect the device to a data acquisition system outside the cryostat. In most cases, this is not an ideal solution due to several reasons, including electronic noise, heat loss into the cryostat, and increase of sealing complexity. Wires going out of the cryostat act like a heat sink, decreasing the efficiency of the cryostat in two ways; more energy is needed to keep the system cold, and coolant is lost through the feed through electric interface.

Furthermore, electrical signals coming from sensors inside the cryostat are only buffered and digitized outside the cryostat, thus increasing the number of wires passing out of the cryostat, and increasing the overall probability of failure due to a bad connection. In applications involving the potential for high voltages such as superconducting magnets, these high voltage wires are typically passing through a cryostat head, and sometimes they have to traverse a long path through cryogenic fluid, possibly passing through a transition region made of vapor where a dielectric breakdown constant is much lower. This can cause electrical discharges inside the cryostat, and result in damage to the system.

SUMMARY

One innovative aspect of the subject matter described in this disclosure can be implemented in a cryogenic system that includes a cryostat and a data acquisition module located within the cryostat. The cryogenic system contains a cryogenic fluid and at least one sensor. The data acquisition module is in communication with the at least one sensor to acquire data. The data acquisition module comprises a thermal package, a conditioning and digitizing electronic module, a controller module, a power module, and a thermal management module.

In some implementations, the thermal package comprises multiple overlapping layers, wherein an outermost layer comprises a material with a low thermal conductivity, a middle layer comprises a metallic layer, and an inner most layer comprises a material with a low thermal conductivity.

In some implementations, the conditioning and digitizing electronic module comprises front end electronics and a digitizer to digitize analog signals produced by the least one sensor. In some implementations, the controller module functions to provide communications, data processing, buffering, and electrically isolating a communication channel. In some implementations, the power module functions to provide power to the conditioning and digitizing electronic module, the thermal management module, and the controller module. In some implementations, the thermal management module functions to provide temperature control to the data acquisition module. In some implementations, the data acquisition module is maintained at a temperature between 70° K to 315° K by the thermal management module.

In some implementations, the thermal management module further comprises a thermal channel and a thermal valve. In some implementations, the thermal channel comprises a thermally conducting material connected to the thermal valve. In some implementations, the thermal valve comprises an electromechanical device that is controlled by the thermal management module.

In some implementations, the cryogenic fluid is at a temperature between 0° K and 90° K.

Another innovative aspect of the subject matter described in this disclosure can be implemented in a data acquisition module for use within a cryogenic system containing a cryogenic fluid and at least one sensor. The data acquisition module comprises a thermal package, a conditioning and digitizing electronic module, a controller module, a power module, and a thermal management module.

In some implementations, the thermal package comprises multiple overlapping layers, wherein an outermost layer comprises a material with a low thermal conductivity, a middle layer comprises a metallic layer, and an inner most layer comprises a material with a low thermal conductivity.

In some implementations, the conditioning and digitizing electronic module comprises front end electronics and a digitizer to digitize analog signals produced by the least one sensor. In some implementations, the controller module functions to provide communications, data processing, buffering, and electrically isolating a communication channel. In some implementations, the power module functions to provide power to the conditioning and digitizing electronic module, the thermal management module, and the controller module. In some implementations, the thermal management module functions to provide temperature control to the data acquisition module. In some implementations, the data acquisition module is maintained at a temperature between 70° K to 315° K by the thermal management module.

In some implementations, the thermal management module further comprises a thermal channel and a thermal valve. In some implementations, the thermal channel comprises a thermally conducting material connected to the thermal valve. In some implementations, the thermal valve comprises an electromechanical device that is controlled by the thermal management module.

In some implementations, the cryogenic fluid is at a temperature between 0° K and 90° K.

BRIEF DESCRIPTION OF THE DRAWINGS

The foregoing aspects and others will be readily appreciated by the skilled artisan from the following description of illustrative embodiments when read in conjunction with the accompanying drawings.

DETAILED DESCRIPTION

Figure 1A:
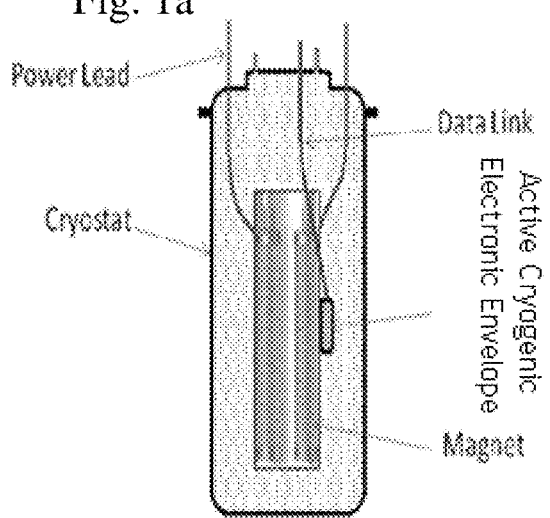
FIG. 1a illustrates an Active Cryogenic Electronic Envelope (ACEE) module inside a cryostat.

In the discussions that follow, various process steps may or may not be described using certain types of manufacturing equipment, along with certain process parameters. It is to be appreciated that other types of equipment can be used, with different process parameters employed, and that some of the steps may be performed in other manufacturing equipment without departing from the scope of this invention. Furthermore, different process parameters or manufacturing equipment could be substituted for those described herein without departing from the scope of the invention.

These and other details and advantages of the present invention will become more fully apparent from the following description taken in conjunction with the accompanying drawings.

Various embodiments of the invention describe an innovative electronic package comprising a data acquisition module that is capable of working at cryogenic temperatures as low as 0° K, and may reside inside a cryostat. Cryogenic fluid may be at a temperature between 0° K and 90° K. Alternatively, Cryogenic fluid may be at a temperature between 0° K and 220° K. The data acquisition module may be utilized with superconductive magnets where the front-end electronics and digitizer may reside inside the cryostat. In addition to superconducting magnet applications, this cryogenic data acquisition module can be deployed in many other fields such as medical diagnostic machines, space exploration activities, and high energy physics experiments, etc.

By managing heat inside the module, and keeping the electronic temperature inside a package envelope in a range of approximately 70° K to 315° K, the electronics package will allow for conventional electronics technologies, such as metal-oxide-semiconductor (MOS), to operate inside cryostats and or dewars. The module will therefore negate the difficulties that arise from changes in carrier mobility, and carrier freeze-out that occur at deep cryogenic temperatures. Although 70° K to 315° K is approximately the internal temperature that the current modules are operating at, there is nothing preventing this parameter from being adjusted for different applications.

There are several advantages in utilizing this system. A significant reduction in electrical noise from signals captured inside the cryostat occurs due to the low temperature that the electronics are immersed in, thus reducing the thermal noise. A shorter distance that signals are transmitted before digitalization reduces pickup and cross-talk between channels. This improved performance in signal-to-noise ratio by itself is a significant advantage. Another important advantage is the simplification of the feedthrough interface on a cryostat head. Data coming out of the cryostat is digital and serial, dramatically reducing the number of lines going through the cryostat feedthrough interface. All lines coming out of the cryostat are digital and low voltage, thus reducing the possibility of electric breakdown inside the cryostat.

The performance of an analog to digital (A to D) converter when the system is immersed in liquid helium, and in liquid nitrogen is described. Parameters such as power dissipation, integral non-linearity, effective number of bits, signal-to-noise and distortion, are presented for both temperatures ranges.

Figure 1B:
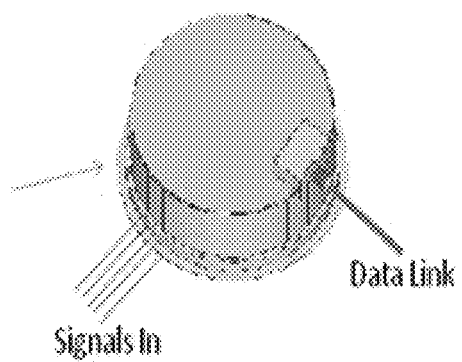
FIG. 1b illustrates the ACEE module in detail.
Figure 2A:
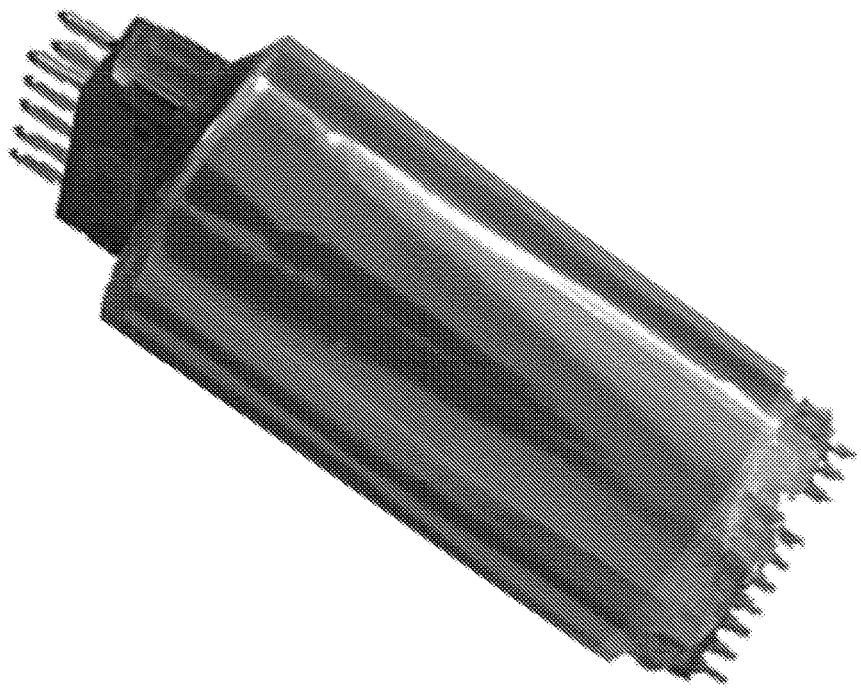
FIG. 2a illustrates an external view of the data acquisition module.

FIG. 1a illustrates an Active Cryogenic Electronic Envelope (ACEE) module inside a cryostat, and FIG. 1b illustrates the ACEE module in detail. FIG. 2a illustrates an external view of the data acquisition module, and FIG. 2b a block diagram illustrating the subsystems that constitute this data acquisition module. FIG. 3a illustrates a thermal envelope, FIG. 3b illustrates an ASIC assembly coupled to a heater through a copper pad, FIG. 3c illustrates a top view of the analog to digital (A to D) package with the heater on top.

The electronics implemented on the internal components of the module can be designed to be radiation hardened utilizing any conventional technique since the operational temperature of the module overlaps the operating range of standard electronics. FIG. 1a illustrates how this system is intended to be deployed in the cryostat. The position of the module is flexible, and it can be located anywhere inside the cryostat. Multiple modules can operate in conjunction within the same cryostat.

Various embodiments of this invention originated from the need to improve instrumentation performance for superconducting magnets. Presently, the back-end instrumentation of superconducting magnets is external to the low temperature cryostat containing the superconductors. Sensors are attached to the superconducting magnet, and wires connect those sensors to a data acquisition system external to the cryostat. This setup degrades the performance of data acquisition due to electronic noise, heat transfer into the cryostat, increased cryostat sealing complexity, and other reasons that will be further discussed in this disclosure. To mitigate these problems a new data acquisition system capable of deep cryogenic operation is disclosed. This system is a valuable asset for the instrumentation of future superconductive magnets and other applications involving cryogenic environments. The need for more sensors to instrument future cryogenic environments will continue to increase.

Table 1 below shows the typical number of sensing wires from recently tested superconducting magnets at the Lawrence Berkeley National Laboratory (LBNL). Presently the number of wires coming out a cryostat is directly proportional to the number of sensing elements inside the cryostat. This is not an ideal solution in that it adds further complexity in the signal feedthrough interface, increasing the probability of failure in the cabling, heat losses, cross talk, and short-circuits between adjacent wires.

The data in Table 1 shows that current superconducting magnets have almost 200 conductors coming out the cryostat. This number could be even higher, but difficulties in routing the feedthrough are already high, and that makes it challenging to add extra sensors. A data acquisition system described herein is capable of operating at cryogenic temperatures and increases the system reliability while vastly decreasing the number of conductors going through the feedthrough to the cryostat exterior.

TABLE 1

Number of sensor wires for magnet instrumentation of three LBNL superconductive magnet prototypes.

| Magnet Name | VTap wires | SG wires | RTD wires | Others wires | Total wires |
|---|---|---|---|---|---|
| TQS03b | 56 | 96 | 16 | 4 | 172 |
| HD03b | 60 | 80 | 16 | 8 | 164 |
| HQ02b | 92 | 80 | 16 | 8 | 196 |

System Description and Capabilities

The basis of the data acquisition system described in various embodiments is the utilization of a reverse cryostat that creates a small thermal bubble inside the main cryogenic vessel. By managing heat inside the module, and keeping the electronic temperature inside the envelope at approximately 85° K, the electronics package allows conventional electronic technologies, such as metal-oxide-semiconductor (MOS), to operate inside cryostats. The module therefore negates the difficulties that arise from changes in carrier mobility and carrier freeze-out that occur at deep cryogenic temperatures. In the case of this module a volume of approximately 1 mm$^3$ is kept at approximately 85° K±1. This volume is contained within a thermal envelope that actively manages the heat inside the package, maintaining the A to D converter temperature constant. The module does this with the help of a thin film heater, and a resistance temperature detector (RTD). The RTD feeds temperature information to a proportional-integral-derivative (PID) controller that in this case is located remotely outside the cryogenic vessel. In another embodiment, the PID is encapsulated with the A to D.

This module has at its heart a 16 channel, 24 bit A to D converter, capable of a sampling frequencies up to 20 kSPS. Channel zero of the A to D is reserved for the RTD, making 15 channels available for collecting sensor information. The Serial Protocol Interface (SPI) interface of this A to D requires a clock (CLK), a serial data in (SDI), a serial data out (SDO), and a chip selected (CS) line. In addition a heater control and two power lines are required, totaling 7 lines.

Figure 2B:
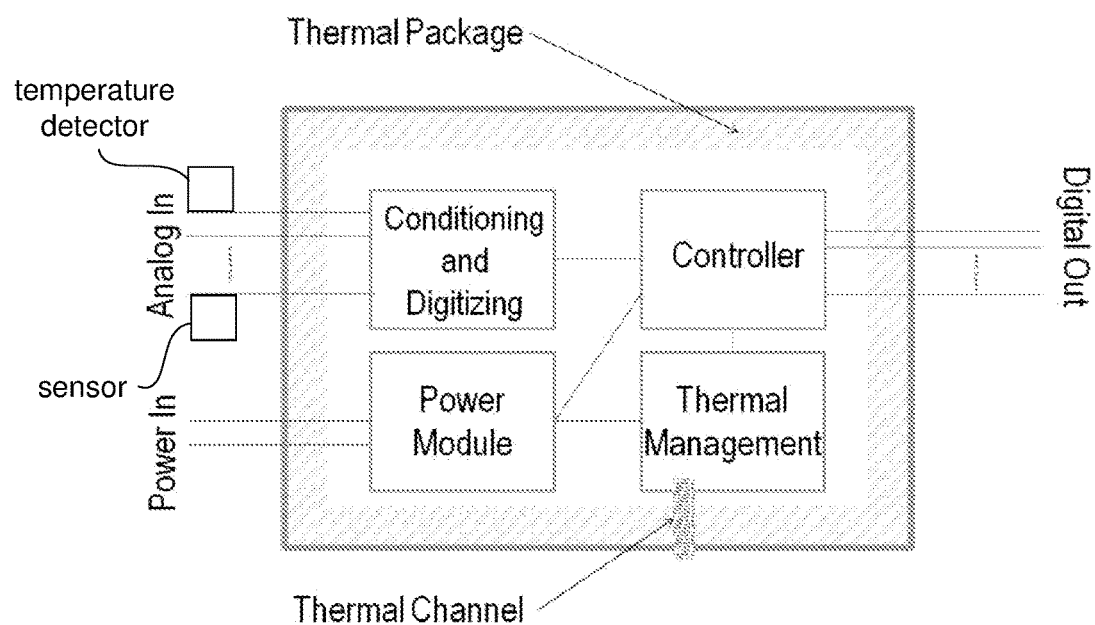
FIG. 2b shows a block diagram illustrating the subsystems that constitute this data acquisition module.
Figure 3A:
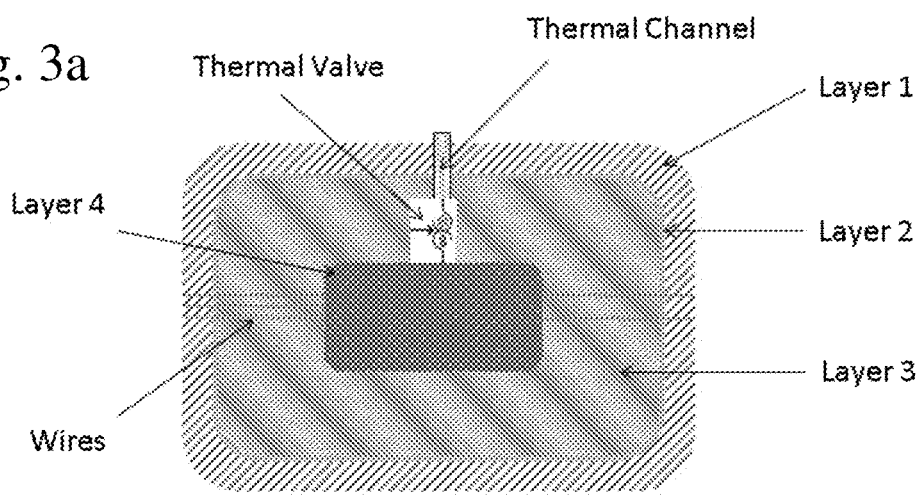
FIG. 3a illustrates a thermal envelope.
Figure 3B:
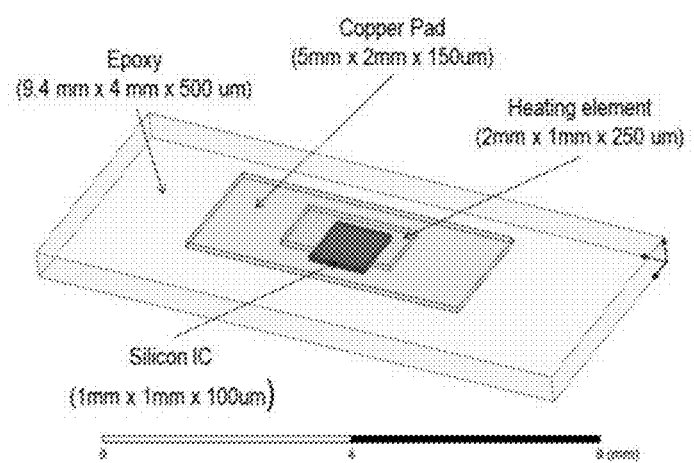
FIG. 3b illustrates an ASIC assembly coupled to a heater through a copper pad.
Figure 3C:
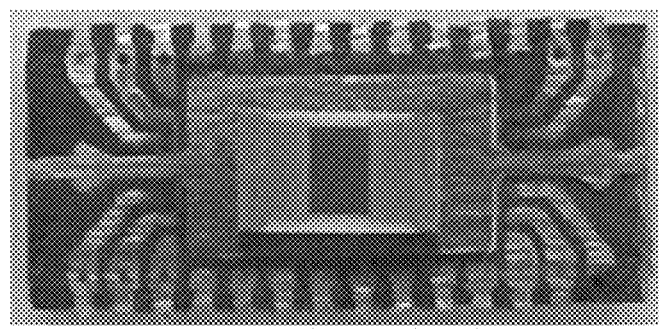
FIG. 3c illustrates a top view of the analog to digital (A to D) package with the heater on top.

FIG. 2a illustrates an external view of the data acquisition module, and FIG. 2b shows a block diagram illustrating the subsystems that constitute this data acquisition module.

The system can be divided in five basic elements as illustrated by FIG. 2b: the thermal package, conditioning and digitizing electronics, controller, power module, and thermal management. Below, these five basic elements will be described.

FIG. 3a illustrates a thermal envelope, FIG. 3b illustrates an ASIC assembly coupled to a heater through a copper pad, and FIG. 3c illustrates a top view of the A to D package with the heater on top.

A thermal package (TP)—The TP is composed by several overlapping layers as illustrated by FIG. 3a. The outmost layer is made of a material with very low thermal conductivity, and that can withstand exposure to cryogenic shock, typically a dark high performance cryogenic epoxy. The second layer is a thin metallic layer that can be deposit by sputtering, or implemented by any other method suitable to create a thin metallic layer. The objective of this layer is to shield the package from electromagnetic waves, and block thermal radiation, acting as a radiant barrier. The third layer, usually the thickest one is composed of a material with very low thermal conductivity, typically an epoxy, aerogel or ceramic. The final layer is composed of a material with high thermal conductivity, and low electrical conductivity, typically an epoxy. Layers can be added or removed to add mechanical strength, or flexibility to this thermal envelope depending on the application.

FIGS. 3b and 3c illustrate the inner most parts of this assembly. In FIG. 3b, in the center, the silicon die of the A to D is coupled to the heating element through a copper pad. The A to D is surrounded by fiber-reinforced plastic. These components are encapsulated by a low thermal conductivity epoxy ($7 \cdot 10^{-2}$ W/m·K)). The outmost layer is a thin metallic film that shields the package from electromagnetic waves, and blocks thermal radiation, acting as a radiant barrier. The filling epoxy is very important because it is mainly responsible for defining the efficiency of the thermal package. It is also the thickest layer and ideally should be composed of a material with the lowest possible thermal conductivity. Other materials, such as aerogels, may be being considered for this layer. Layers can be added or removed to add mechanical strength, or flexibility to the thermal envelope depending on the application. FIG. 3c illustrates the top view of the A to D package with the heater on top.

In addition to the above mentioned layers, FIG. 3a illustrates that the TP has a thermal channel (TC), and a thermal valve (TV). The thermal channel is a thermally conducting line, typically copper that is connected to a thermal valve. The thermal valve in this module is electromechanical, and it is controlled by the thermal management module. The goal of the thermal valve, and the thermal channel is to release heat from the electronic envelope to the cryostat if the internal temperature rises above the preset conditions, effectively acting as part of the thermal management block.

The conditioning and digitizing electronics (CDE) block contains the front end electronics and digitizer, the main goal of this block is to digitize analog signals coming from sensors such as strain gauges, Hall Effect probes, temperature probes, voltage taps, and any other electronic sensor that provides analog signals. In this module we are utilizing a 24 bits, 20 kSPS Commercial Off-The-Shelf (COTS) repackaged A to D assembled on a Printed Circuit Board (PCB). This particular A to D was selected due to its capability of operating at 85° K. This A to D has 16 input multiplexed channels. Channel zero of the A to D is directly wired to the RTD, making in total 15 channels available for collecting sensor data.

The controller module is responsible for communications, data processing, buffering, and electrically isolating the communication channel if needed. This module is responsible for implementing the electrical characteristics of the physical layer where information will flow, such as; LVDS, LVCMOS, TTL, or any other electrical signaling protocol. If the application requires communications to be performed optically, this module will contain the optical fiber transceiver instead of an electrical one. This module is also responsible for data framing. Depending on requirements, this module can be fused with the CDE module. This controller can act as a router, and buffer data coming from the external sensors, as well as, internal data. The controller module can also receive external commands such as inquires on the internal temperature of the module, or the setting of a new operation temperature window for the package. The A to D communicates through a 2.4 MHz Serial Protocol Interface (SPI), and requires four wires to receive commands, and transmit data.

The power module (PM) is responsible for providing power to the electronic envelope. Depending on the application the PM can regulate the external power, and electrically isolate the module. If electrical isolation is required it can be implemented optically or magnetically. In the case of magnetic isolation an electrical transformer is utilized and its output rectified. In case optical isolation is required the power module receives electricity by means of wires that is then transformed to electromagnetic radiation by a photo diode, and then converted back to electricity via photovoltaic cells. The electricity can then flow to a voltage regulator or go directly to feed the electronic package. During the module evaluation a successful test was performed with a photovoltaic cell array coupled to a photo diode. The coupling efficiency was 33%, and the excess heat was utilized to keep the package at 85° K. Due to the low efficiency, and since strain gauges don't need to be isolated in the target application, this module is not being utilized in the current application.

Finally, the thermal management module (TM) acts as temperature controller. It monitors the internal temperature of the electronic package and acts on it to keep it within a predetermined range. There are two mechanisms inside the electronic package that allows temperature to be manipulated. The first is the thermal valve as described above, it allows heat to flow from inside the device to the outside by connecting it to the cryogenic environment. The second mechanism to control the internal temperature is to increase internal heat generation, by either increasing the power dissipation on the active electronic components inside the package, or by turning on an internal heater. This internal heater is in intimate contact with the electronics and can be adjusted up or down. For this module the temperature controller is a proportional-integral-derivative (PID) controller implemented remotely by a microprocessor.

Results and Discussion

The cryogenic DAQ module was tested utilizing two different types of dewars, the first containing liquid nitrogen (LN), and the second liquid helium (LHe). When operating at LN temperatures the A to D consumed 400 uW to operate, while the heater was consuming only 1 mW to keep the die at 85° K. In contrast, when operating at LHe temperatures, the heater needs to dissipate 40 mW for the current module to operate. Since in both cases the A to D temperature was kept at 85° K its electrical performance was identical for LN, and LHe. The heater operation was very different for the two cases. While in LN the module could be dipped in LN with the heater off, however, that was not the case for LHe. When immersed in LHe the heater had to be kept on all the times or permanent damage from a coefficient of thermal expansion (CTE) mismatch would occur. This problem is under investigation, but all evidence points to stress on the aluminum wire bonds connecting the package leads to the ASIC pads due to the rapid change in temperature.

Figure 4A:
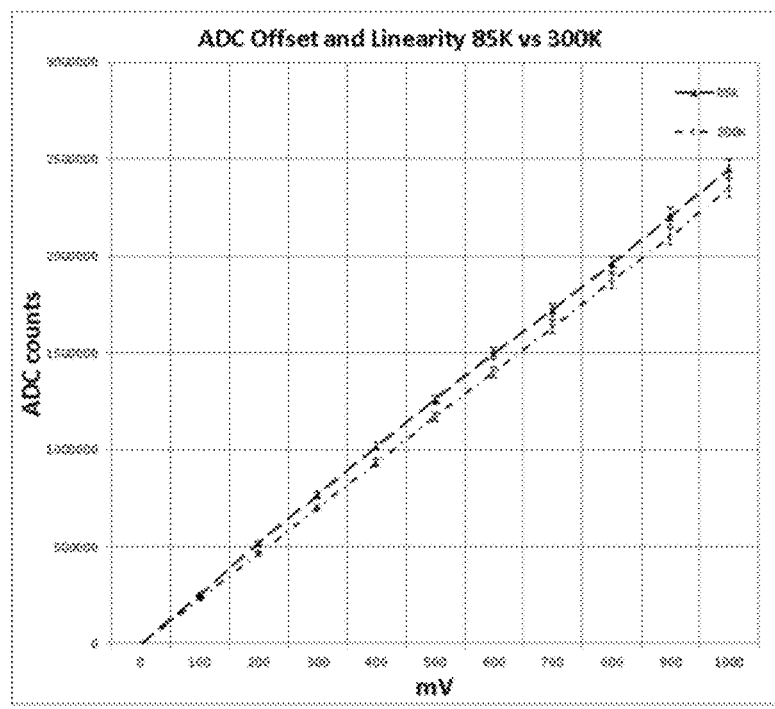
FIG. 4a illustrates linearity of the A to D at 85K and 300K.

The A to D noise and linearity where studied while operating with a sampling frequency of 5 Hz and power supply set to 2.5V at 85° K, and 300° K. The system linearity shows a small degradation when operated at 85° K. The integral nonlinearity (INL) changed from 2 ppm of the reference voltage at 300° K, to 18 ppm at 85° K. INL is an important parameter because it can't be calibrated out. In addition, a change in the slope was noticed as illustrated by FIG. 4a, but this is not a significant problem since it can be compensated.

Figure 4B:
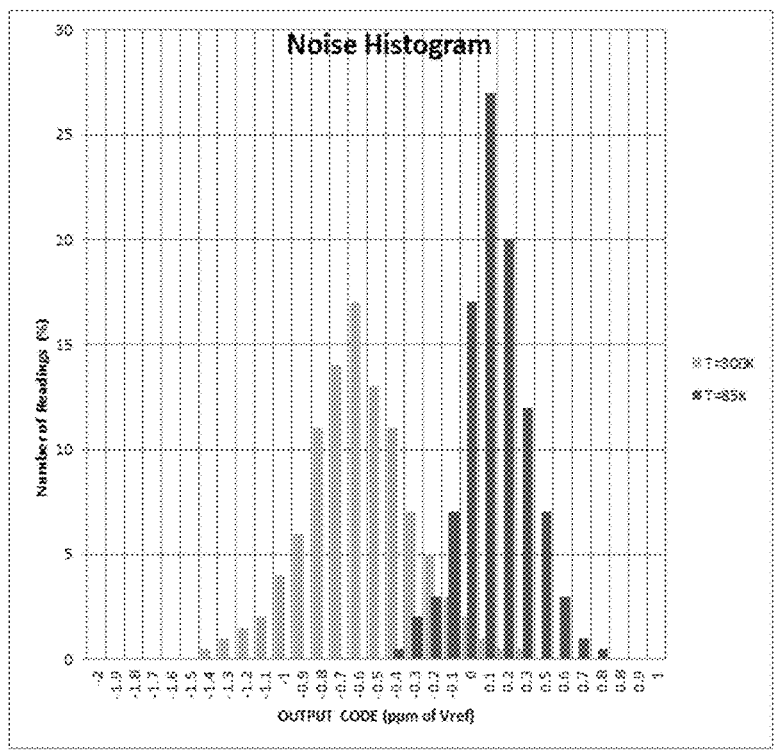
FIG. 4b illustrates noise Noise performance of the A to D for 300K; σ=0.39 ppm, μ=0.55 ppm. For 85K; σ=0.14 ppm, μ=0.16 ppm. This test was performed with Vref=1V, 5000 samples accumulated, Vin=0, and Fs=5 Hz.

The noise performance of the A to D improved from a deviation of 0.39 ppm of the reference at 300° K to a deviation of only 0.16 ppm as illustrated by FIG. 4b. The root-mean-square noise improved from 1 uV at 300K to 600 nV at 85K when sampling at 5 Hz.

When not considering the heater, the A to D actually reduced its power consumption from 600 uW at 300K to 400 uW. When utilized in conjunction with micro-measurements full bridge strain gauges (350Ω, SK-13-120NB-350) and a 5 mA current source, the effective number of bits of the A to D was 22 bits. All above mentioned tests where performing with the power supply operating at 2.5V and the voltage reference at 1V.

CONCLUSIONS AND NEXT STEPS

Various embodiments of the invention demonstrate that it is possible to operate a compact low power data acquisition module inside cryostats and dewars. This offers a new paradigm for data acquisition at liquid helium temperatures in that the collected information from sensors inside the cryostat can come out in digital format to the cryostat head. There are several advantages to this approach, namely increased robustness on the cabling, reduced thermal noise on the A to D, a small number of wires going out the cryostat, and low voltage digital signal lines.

Additional embodiments of the invention also include an optically isolated power supply, an internal current source for strain gauges, a completely embedded thermal management system, and improved cryogenic insulation. The electronics implemented on the internal components have been designed to be radiation hardened with any conventional technique since the operational temperature of the module is in the operating range of standard electronics. The position of the module is flexible, and it can be located anywhere inside the cryostat. Multiple modules can operate in network within the same cryostat sharing the digital communication lines.

Additional embodiments of the invention also expand the range of applications of this system. The vast majority of commercially available active electronic components do not operate at temperatures below 220K. This is due to several factors such as carrier freeze out, hot-carrier effects, and commercially available systems not being generally design for low temperature operation. There are a significant number of applications that need to operate at temperatures below 220K, such as Liquid Natural Gas (LNG) storage and transportation, Magnet Resonance Imaging (MRI), biology and physics experiments, cryogenic freezers, and several other industrial processes where this system can be deployed.

What is claimed is:

1. A cryogenic system comprising:
   a cryostat containing a cryogenic fluid and at least one sensor; and
   a data acquisition module located within the cryostat, the data acquisition module in communication with the at least one sensor to acquire data, the data acquisition module comprising a thermal package comprising:
   a conditioning and digitizing electronic module,
   a controller module,
   a power module, and
   a thermal management module, the thermal management module operable to provide temperature control to the data acquisition module to maintain the data acquisition module at a temperature between 70 K to 315 K, the thermal management module operable to control a heater based on a measurement from a temperature detector.

2. The cryogenic system of claim 1, wherein the thermal package comprises multiple overlapping layers, wherein an outermost layer comprises a material with a low thermal conductivity, wherein a middle layer comprises a metallic layer, and wherein an inner most layer comprises a material with a low thermal conductivity.

3. The cryogenic system of claim 1, wherein the conditioning and digitizing electronic module comprises front end electronics and a digitizer operable to digitize analog signals produced by the at least one sensor.

4. The cryogenic system of claim 1, wherein the controller module is operable to provide communications, data processing, and buffering, and to electrically isolate a communication channel.

5. The cryogenic system of claim 1, wherein the power module is operable to provide power to the conditioning and digitizing electronic module, the thermal management module, and the controller module.

6. The cryogenic system of claim 1, wherein the heater comprises a thin film heater, and wherein the temperature detector comprises a resistance temperature detector (RTD).

7. The cryogenic system of claim 1, wherein the thermal package further comprises a thermal channel and a thermal valve.

8. The cryogenic system of claim 7, wherein the thermal channel comprises a thermally conducting material connected to the thermal valve.

9. The cryogenic system of claim 8, wherein the thermal valve comprises an electromechanical device that is controlled by the thermal management module.

10. The cryogenic system of claim 1, wherein cryogenic fluid is at a temperature between 0 K and 90 K.

11. A data acquisition module for use within a cryogenic system containing a cryogenic fluid and at least one sensor, comprising:
    a thermal package comprising:
    a conditioning and digitizing electronic module;
    a controller module;
    a power module; and
    a thermal management module, the thermal management module operable to provide temperature control to the data acquisition module to maintain the data acquisition module at a temperature between 70 K to 315 K, the thermal management module operable to control a heater based on a measurement from a temperature detector.

12. The data acquisition module of claim 11, wherein the thermal package comprises multiple overlapping layers, wherein an outermost layer comprises a material with a low thermal conductivity, wherein a middle layer comprises a metallic layer, and wherein an inner most layer comprises a material with a low thermal conductivity.

13. The data acquisition module of claim 11, wherein the conditioning and digitizing electronic module comprises front end electronics and a digitizer operable to digitize analog signals produced by the at least one sensor.

14. The data acquisition module of claim 11, wherein the controller module is operable to provide communications, data processing, and buffering, and to electrically isolate a communication channel.

15. The data acquisition module of claim 11, wherein the power module is operable to provide power to the conditioning and digitizing electronic module, the thermal management module, and the controller module.

16. The data acquisition module of claim 11, wherein the heater comprises a thin film heater, and wherein the temperature detector comprises a resistance temperature detector (RTD).

17. The data acquisition module of claim 11, wherein the thermal package further comprises a thermal channel and a thermal valve.

18. The data acquisition module of claim 17, wherein the thermal channel comprises a thermally conducting material connected to the thermal valve.

19. The data acquisition module of claim 18, wherein the thermal valve comprises an electromechanical device that is controlled by the thermal management module.

20. The data acquisition module of claim 11, wherein cryogenic fluid is at a temperature between 0 K and 90 K.

* * * * *